United States Patent
Koh et al.

(10) Patent No.: US 8,957,437 B2
(45) Date of Patent: Feb. 17, 2015

(54) ORGANIC LIGHT EMITTING DIODE DISPLAY

(75) Inventors: Sung-Soo Koh, Yongin (KR);
Hee-Seong Jeong, Yongin (KR);
Chul-Woo Jeong, Yongin (KR);
Soon-Ryong Park, Yongin (KR);
Woo-Suk Jung, Yongin (KR); Il-Ryong Cho, Yongin (KR); Tae-Kyu Kim, Yongin (KR); Jae-Yong Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 215 days.

(21) Appl. No.: 12/910,688

(22) Filed: Oct. 22, 2010

(65) Prior Publication Data

US 2011/0175123 A1 Jul. 21, 2011

(30) Foreign Application Priority Data

Jan. 18, 2010 (KR) ........................ 10-2010-0004502

(51) Int. Cl.
*H01L 33/00* (2010.01)
*H01L 51/52* (2006.01)
*H01L 27/32* (2006.01)

(52) U.S. Cl.
CPC ........ *H01L 51/5265* (2013.01); *H01L 51/5281* (2013.01); *H01L 51/524* (2013.01); *H01L 2251/5323* (2013.01); *H01L 51/5293* (2013.01); *H01L 27/3244* (2013.01)
USPC ........................................... 257/98; 257/103

(58) Field of Classification Search
USPC ................. 257/29–103; 438/22–47
See application file for complete search history.

(56) References Cited

U.S. PATENT DOCUMENTS

| | | | |
|---|---|---|---|
| 2004/0109106 A1* | 6/2004 | Yang et al. ...................... 349/69 |
| 2005/0052348 A1* | 3/2005 | Yamazaki et al. .............. 345/44 |
| 2006/0033424 A1* | 2/2006 | Ko ................... 313/501 |
| 2006/0043510 A1* | 3/2006 | Yamazaki et al. ............ 257/432 |
| 2007/0132365 A1* | 6/2007 | Kang et al. .................... 313/500 |
| 2008/0084159 A1 | 4/2008 | Fery et al. |
| 2008/0218069 A1* | 9/2008 | Kim et al. .................... 313/506 |
| 2008/0304248 A1* | 12/2008 | Jin et al. .......................... 362/19 |
| 2009/0072693 A1 | 3/2009 | Cok et al. |

(Continued)

FOREIGN PATENT DOCUMENTS

| | | |
|---|---|---|
| JP | 2001-244068 | 9/2001 |
| JP | 2005-044778 | 2/2005 |

(Continued)

OTHER PUBLICATIONS

Hanzawa, F., Chapter 21: Lens Films and Reflective Polarization Films, 2009, LCD Backlights, pp. 257-267.*

*Primary Examiner* — Karen Kusumakar
(74) *Attorney, Agent, or Firm* — Christie, Parker & Hale, LLP

(57) ABSTRACT

An OLED display including: a substrate main body; a first transflective electrode formed on the substrate main body; an organic emission layer formed on the first transflective electrode; a second transflective electrode formed on the organic emission layer; and a dual brightness enhancement film (DBEF) disposed on a dual brightness enhancement film (DBEF) on at least one of a side of the first transflective electrode facing away from the organic emission layer, or a side of the second transflective electrode facing away from the organic emission layer.

16 Claims, 5 Drawing Sheets

(56) References Cited

U.S. PATENT DOCUMENTS

2009/0256169 A1 * 10/2009 Yokoyama et al. ............ 257/98
2009/0267502 A1   10/2009 Diekmann et al.

FOREIGN PATENT DOCUMENTS

| JP | 2005-067367 | 3/2005 |
|----|-------------|--------|
| JP | 2005-108540 | 4/2005 |
| JP | 2007-141728 | 6/2007 |
| JP | 2007-141824 | 6/2007 |
| JP | 2008-524819 | 7/2008 |
| JP | 2009-049223 | 3/2009 |
| JP | 2009-146667 | 7/2009 |
| JP | 2010-505246 | 2/2010 |
| JP | 2010-539653 | 12/2010 |
| KR | 10-2005-0018401 | 2/2005 |
| KR | 10-2008-0015960 | 2/2008 |
| KR | 10-2008-0040511 | 5/2008 |
| KR | 10-2008-0065120 | 7/2008 |

* cited by examiner

ORGANIC LIGHT EMITTING DIODE DISPLAY

CROSS-REFERENCE TO RELATED APPLICATION

This application claims priority to and the benefit of Korean Patent Application No. 10-2010-0004502, filed in the Korean Intellectual Property Office on Jan. 18, 2010, the entire content of which is incorporated herein by reference.

BACKGROUND

1. Field

The following description relates generally to an organic light emitting diode (OLED) display. More particularly, it relates to a dual-side emission type of OLED display.

2. Description of the Related Art

An organic light emitting diode (OLED) display is a self emissive display device that displays images with organic light emitting diodes. The organic light emitting diode emits light by way of energy generated when excitons (the excitons being combinations of electrons and holes) within an organic emission layer fall from an excited state to a ground state, and the OLED display displays an image using the light.

When the OLED display is used in a bright area, black color expression and contrast thereof become poor due to the reflection of external light. In order to solve such a problem, polarizing and phase retardation plates are provided on the organic light emitting diode so as to suppress the reflection of external light. However, when the polarizing and phase delay plates are used, some of the light generated from the organic emission layer is lost or eliminated when the light is emitted to the outside of the OLED display through the polarizing and the phase delay plates.

The OLED display is a self emissive display that does not use an external light source so that it can display an image on both sides concurrently or simultaneously. However, when the conventional polarizing plate and the phase delay plate are applied to the dual-side emission type of OLED display, loss of light generated from the organic emission layer is further increased.

The above information disclosed in this Background section is only for enhancement of understanding of the background of the described technology and therefore it may contain information that does not form the prior art that is already known in this country to a person of ordinary skill in the art.

SUMMARY

Exemplary embodiments have been made in an effort to provide a dual-side emission type of OLED display with improved light efficiency.

An OLED display according to an exemplary embodiment includes: a substrate main body; a first transflective electrode on the substrate main body; an organic emission layer on the first transflective electrode; a second transflective electrode on the organic emission layer; and a dual brightness enhancement film (DBEF) on at least one of a side of the first transflective electrode facing away from the organic emission layer, or a side of the second transflective electrode facing away from the organic emission layer.

In one embodiment, the first and second transflective electrodes include a transparent conductive material. The transparent conductive material may comprise at least one of indium tin oxide (ITO), indium zinc oxide (IZO), zinc oxide (ZnO), or indium oxide ($In_2O_3$). In one embodiment, one of the first and second transflective electrodes for injecting holes into the organic emission layer comprises the transparent conductive material.

In one embodiment, the first and second transflective electrodes comprise a transflective metal. The transflective metal may comprise magnesium (Mg), silver (Ag), gold (Au), calcium (Ca), lithium (Li), chromium (Cr), aluminum (Al), or an alloy thereof. In one embodiment, the transflective metal has a thickness of 5 nm to 50 nm.

In one embodiment, the first and second transflective electrodes comprise a transparent conductive material and a transflective metal In one embodiment, the DBEF is configured to pass light parallel with a polarization axis and to reflect light not parallel with the polarization axis.

In one embodiment, an encapsulation member is disposed facing the substrate main body and covering the first transflective electrode, the organic emission layer, and the second transflective electrode. Here, light generated from the organic emission layer may be emitted in a direction to the substrate main body or the encapsulation member to display an image. The DBEF may be on the second transflective electrode. In one embodiment, a polarizing plate is attached to the encapsulation member, and the polarizing plate has a polarization axis parallel with the DBEF. The DBEF may be disposed below the first transflective electrode. In one embodiment, a polarizing plate is further attached with the substrate main body, and the polarizing plate has a polarization axis parallel with the DBEF.

According to the exemplary embodiments, the OLED display can improve light efficiency while displaying an image on both sides.

DETAILED DESCRIPTION

Figure 1:
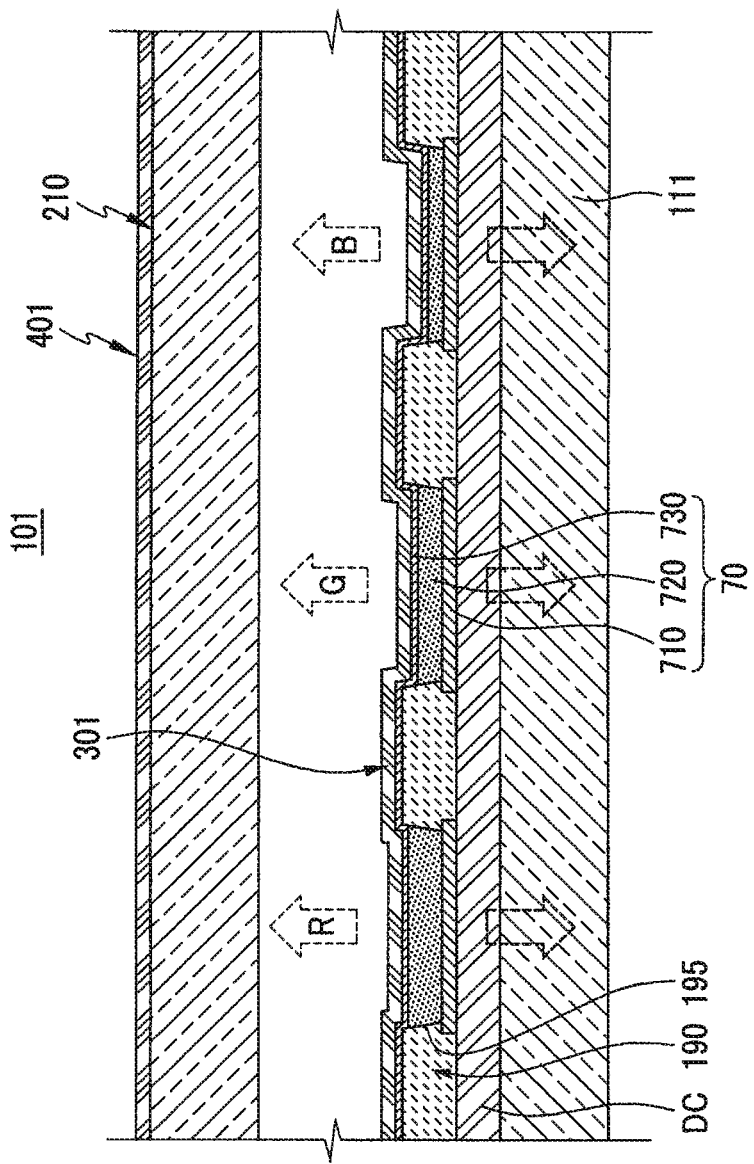
FIG. 1 is a partial cross-sectional view of an OLED display according to a first exemplary embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Like reference numerals designate like elements throughout the specification. In exemplary embodiments other than the first exemplary embodiment among several exemplary embodiments, elements different from those of the first exemplary embodiment will be described.

Furthermore, as the size and thickness of the respective structural components shown in the drawings are arbitrarily illustrated for explanatory convenience, the present invention is not necessarily limited to as illustrated.

In the drawings, the thickness of layers, films, panels, regions, etc., are exaggerated for clarity. In the drawings, for better understanding and ease of description, thicknesses of some layers and areas are excessively displayed. It will be understood that when an element such as a layer, film, region, or substrate is referred to as being "on" another element, it can be directly on the other element or one or more intervening elements therebetween may also be present.

Hereinafter, referring to FIG. 1 to FIG. 4, an OLED display 101 according to a first exemplary embodiment will be described.

As shown in FIG. 1, the OLED display 101 according to the first exemplary embodiment includes a substrate main body 111, a driving circuit (DC), an organic light emitting element 70, a dual brightness enhancement film (DBEF) 301, and an encapsulation member 210. In addition, the OLED display 101 further includes a polarizing plate 401.

The substrate main body 111 may be formed of a transparent insulating material made of glass, quartz, or ceramic, or may be formed of a transparent flexible substrate made of plastic.

The driving circuit DC is formed on the substrate main body 111. The driving circuit DC includes thin film transistors 10 and 20 (refer to FIG. 3) and a capacitor 80 (refer to FIG. 3), and drives the organic light emitting element 70. That is, the organic light emitting element 70 displays an image by emitting light according to a driving signal transmitted from the driving circuit DC.

The organic light emitting element 70 includes a first transflective electrode 710, an organic emission layer 720, and a second transflective electrode 730. The OLED display 101 according to the first exemplary embodiment is a dual-side emission type of OLED display. That is, as marked with arrows in FIG. 1, light generated from the organic light emitting element 70 is passed through both the substrate main body 111 and the encapsulation member 210 and then emitted out of the OLED display 101.

The first transflective electrode 710 and the second transflective electrode 730 include a transparent conductive material and/or a transflective metal.

The transparent conductive material includes indium tin oxide (ITO), indium zinc oxide (IZO), zinc oxide (ZnO), and/or indium oxide (In2O3).

The transflective metal is made of magnesium (Mg), silver (Ag), gold (Au), calcium (Ca), lithium (Li), chromium (Cr), aluminum (Al), or an alloy thereof.

The transflective metal has a thickness between 5 nm and 50 nm. Transmittance and reflectance of the light are changed according to the thickness of the transflective metal. In more detail, transmittance of the light is increased as the thickness of the transflective metal is decreased, and is decreased as the thickness of the transflective metal is increased. When the thickness of the transflective metal is greater than 50 nm, the transmittance of the light is excessively decreased so that it may not be appropriate for the dual-side emission type of OLED display. By contrast, when the thickness of the transflective metal is smaller than 5 nm, electric characteristics become deteriorated.

In the first exemplary embodiment, the first transflective electrode 710 is an anode which is a hole injection electrode, and the second transflective electrode 720 is a cathode which is an electron injection electrode.

Figure 2:
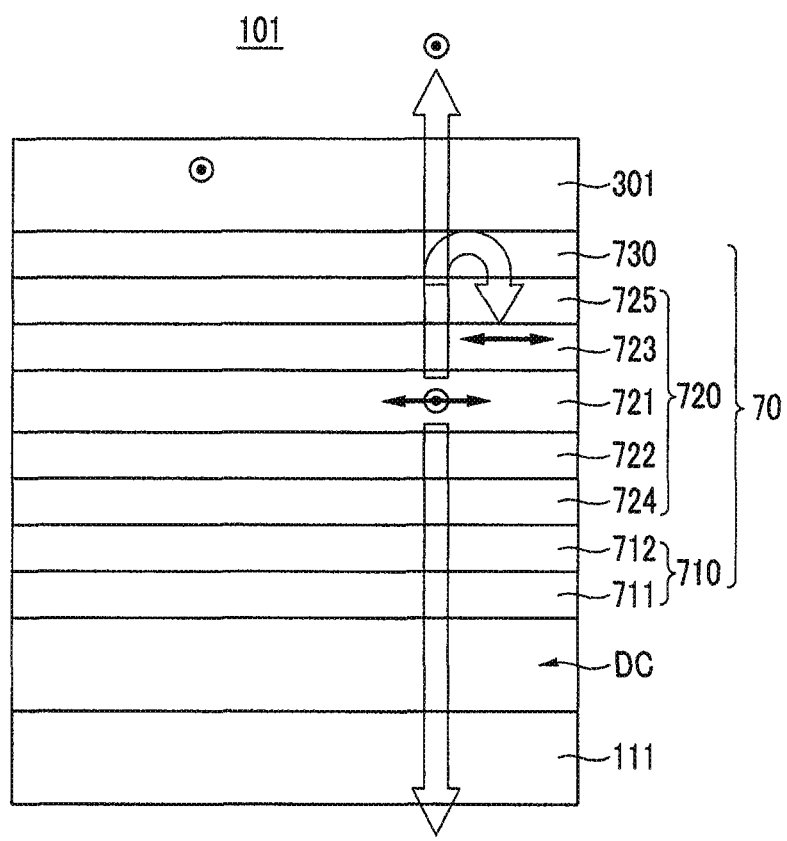
FIG. 2 is an enlarged cross-sectional view of an organic light emitting element of FIG. 1.

As shown in FIG. 2, the first transflective electrode 710 includes a transflective layer 711 made of a transflective metal, and a transparent layer 712 made of a transparent conductive material. In addition, the second transflective electrode 730 is made of a transflective metal.

Both the transflective layer 711 of the first transflective electrode 710 (made of the transflective metal) and the second transflective electrode 730 have relatively low work functions. Therefore, the second transflective electrode 730, which is the electron injection electrode, can efficiently perform electron injection. However, it may be difficult for the first transflective electrode 710, which is the hole injection electrode, with just the transflective layer 711 to perform efficient hole injection. Thus, the transparent layer 712 having a relatively high work function is disposed between the transflective layer 711 and the organic emission layer 720 for efficient hole injection of the first transflective electrode 710.

However, the first exemplary embodiment is not limited to the above description. That is, the first transflective electrode 710 may be a cathode which is an electron injection electrode, and the second transflective electrode 730 may be an anode which is a hole injection electrode. In this case, the structures of the first transflective electrode 710 and the second transflective electrode 730 may be switched.

The organic emission layer 720 has a multi-layered structure including an emission layer 721 and at least one of a hole injection layer (HIL) 724, a hole transport layer (HTL) 722, an electron transport layer (ETL) 723, and an electron injection layer (EIL) 725. Excluding the emission layer 721, the other layers 722, 723, 724, and 725 may be omitted as necessary. If the organic emission layer 720 includes all the layers 721, 722, 723, 724, and 725, the hole injection layer (HIL) 724 is disposed on the transparent layer, which is the hole injection electrode, and the hole transport layer (HTL) 722, the emission layer 721, the electron transport layer (ETL) 723, and the electron injection layer (EIL) 725 are sequentially stacked thereon. Alternatively, the organic emission layer 720 may include other layers as necessary.

Since the organic emission layer 720 is disposed between the first transflective electrode 710 and the second transflective electrode 730, the OLED display 101 can improve use efficiency of light, that is, luminance of light, using the microcavity effect. The microcavity effect can be maximized by controlling a distance between the first transflective electrode 710 and the second transflective electrode 730 of the organic light emitting element 70. In addition, the distance between the first and second transflective electrodes 710 and 730 for increasing and maximizing the microcavity may be changed according to a color of light emitted from the organic light emitting element 70.

Here, the distance between the two electrodes 710 and 730 becomes the largest in an organic light emitting element 70 that emits red-based light, and becomes the smallest in an organic light emitting element 70 that emits blue-based light.

Therefore, luminance efficiency with respect to the power can be effectively improved by arranging cavities having different thicknesses according to a color of emitted light in the organic light emitting element 70. That is, the thickest cavity layer may be disposed at the organic light emitting element 70 that emits red-based light and the thinnest cavity layer may be disposed at the organic light emitting element 70 that emits blue-based light, or the thinnest cavity layer may be omitted.

Thus, as shown in FIG. 1, the organic light emitting element 70 that emits red-based light is relatively thick, and the organic light emitting element 70 that emits blue-based light is relatively thin in the OLED display according to the first exemplary embodiment.

Alternatively, the cavity layer may be individually formed between the first and second transflective electrodes 710 and 730, and the hole injection layer (HIL) 724, the hole transport layer (HTL) 722, the electron transport layer (ETL) 723, and/or the electron injection layer (EIL) 725 of the organic emission layer 720 may be formed to be thick or have the suitable thickness so as to be used as a cavity layer. In addition, the transparent layer 712 of the first transflective electrode 710 of the organic light emitting element 70 may be formed to be thick so as to be used as a cavity layer.

The DBEF 301 is formed on the second transflective electrode 730. The DBEF 301 passes light that is parallel with a polarization axis and reflects light that is not parallel with the polarization axis. Thus, light passed through the DBEF 301 is linearly polarized in a polarization axis direction of the DBEF 301.

The DBEF 301 can be manufactured using various suitable methods. For example, the DBEF 301 may be made of a mixture of a polymer and nanowires, or may be made by using cholesteric liquid crystal and/or nematic liquid crystal.

The encapsulation member 210 is disposed facing the substrate main body 111 to cover the organic light emitting element 70 and the driving circuit. Although it is not shown, the substrate main body 111 and the encapsulation member 210 are attached to each other in a vacuum-tight manner by a sealant formed along the edge of the encapsulation member 210. The encapsulation member 210 may be formed of a transparent insulating substrate made of glass, quartz, ceramic, or plastic.

However, the first exemplary embodiment is not limited to the above description. That is, the encapsulation member 210 may have an encapsulation thin film structure having a transparent organic and/or inorganic layer or having transparent insulating organic and/or inorganic layers that are stacked together.

The polarizing plate 401 is attached to the encapsulation member 210. In this case, a polarization axis of the polarizing plate 401 is arranged in the same manner as the polarizing axis of the DBEF 301. Further, in FIG. 1, the polarizing plate 401 is attached on the encapsulation member 210, but the first exemplary embodiment is not limited thereto. Thus, the polarizing plate 401 may be attached to a side that faces the DBEF 301 of the encapsulation member 210, that is, below the encapsulation member 210. Alternatively, the polarizing plate 401 may be disposed above the DBEF 301, and may be omitted as necessary.

The OLED display 101 further includes a pixel defining layer 190 having an opening 195 that exposes at least a part of the first transflective electrode 710.

With the above configuration, the OLED display 101 according to the first exemplary embodiment can improve light efficiency while displaying an image on both sides.

In addition, the OLED display can improve visibility by suppressing reflection of external light and minimize or reduce loss of light emitted to the outside from the organic light emitting element 70.

Hereinafter, referring to FIG. 2, the operation effect of the dual-side emission type of OLED display 101 including the DBEF 301 according to the first exemplary embodiment will be described in more detail.

As shown in FIG. 2, a part of light generated from the emission layer 721 passes the first and second transflective electrodes 710 and 730, and another part of the light is iteratively reflected between the first and second transflective electrodes 710 and 730. Through such a microcavity effect, the OLED display 101 can improve light efficiency.

The light having passed through the first transflective electrode 710 is partially passed through the DBEF 301 and partially reflected thereby. In more detail, light of which the phase is parallel with the polarization axis of the DBEF 301 is passed, and light of which the phase is not parallel with the polarization axis of the DBEF 301 is reflected. The light reflected by the DBEF 301 is passed through the first and second transflective electrodes 710 and 730 and then emitted to the opposite direction, or reflects between the first transflective electrode 710 and the second transflective electrode 730. Accordingly, reflectance is increased by the DBEF 301 and thus the microcavity effect is increased and/or maximized.

As described, the OLED display according to the first exemplary embodiment emits linearly polarized light in one direction and emits light containing a linear polarization component in the other direction.

In addition, as shown in FIG. 1, reflection of the external light can be reduced by disposing the polarizing plate 401 on (above or with) the DBEF 301. Since the polarizing plate 401 passes light that is parallel with the polarizing axis and absorbs light that is not parallel with the polarizing axis, a large amount of external light toward the organic emission layer 720 is absorbed while passing through the polarizing plate 401. By contrast, light generated from the organic emission layer 720 and passed through the polarizing plate 401 passes first through the DBEF 301 having a polarizing axis that is the same as the polarizing axis of the polarizing plate 401 so that light loss can be increased or minimized.

Figure 3:
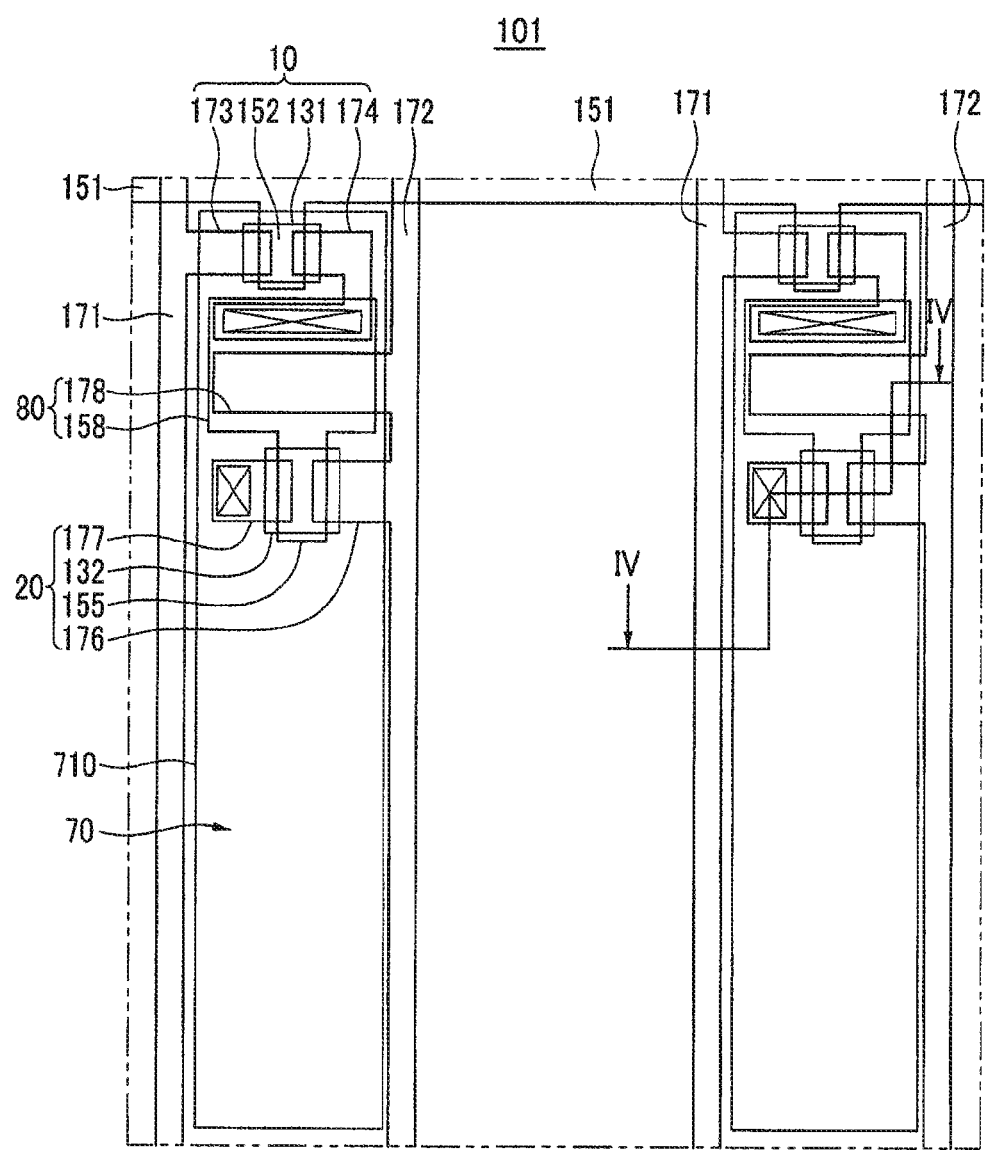
FIG. 3 is a layout view of a pixel circuit of the OLED display of FIG. 1.
Figure 4:
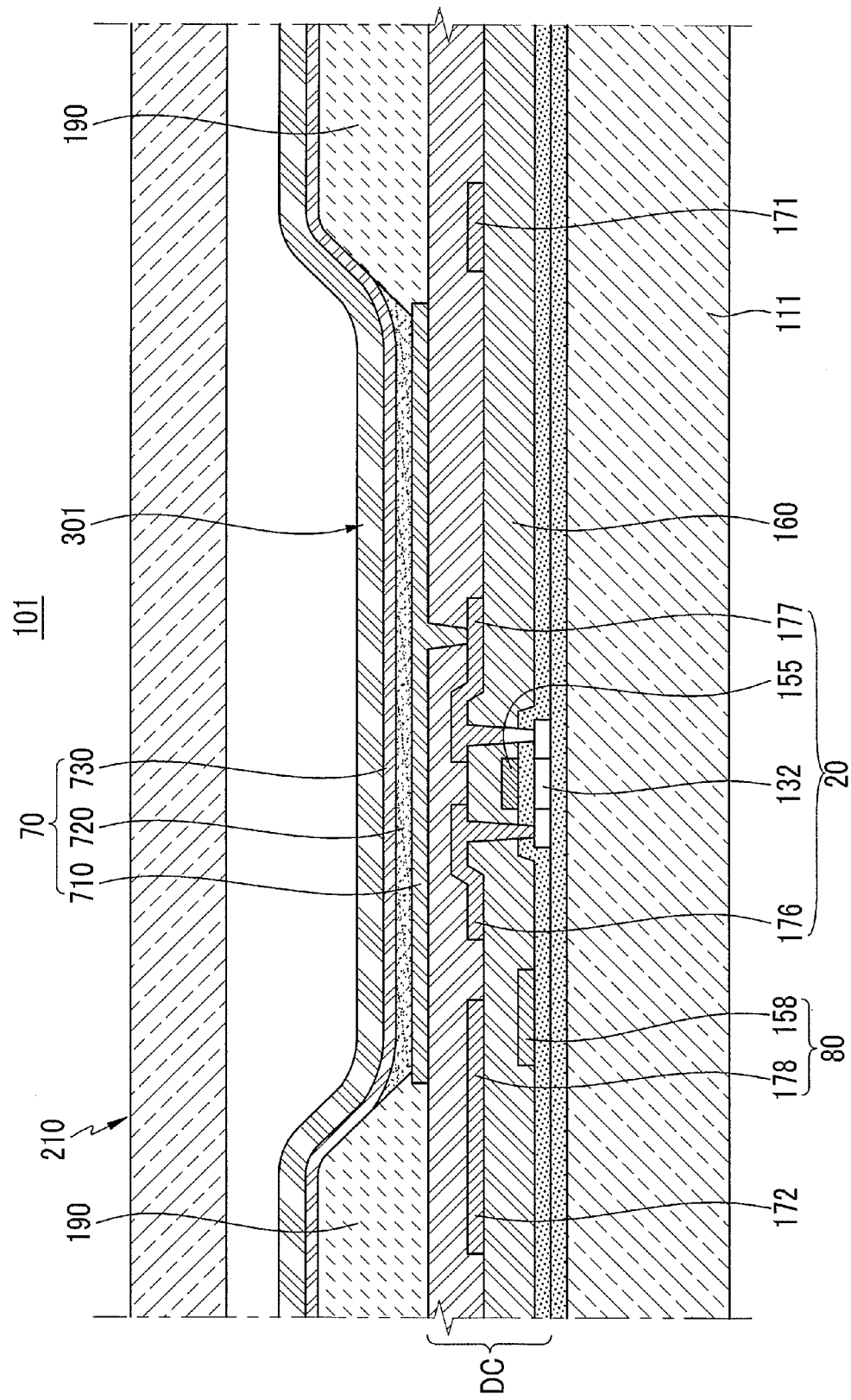
FIG. 4 is a cross-sectional view of FIG. 3, taken along the line IV-IV.

Hereinafter, an internal structure of the OLED display 101 will be described in more detail with reference to FIG. 3 and FIG. 4. FIG. 3 is a layout view of a pixel structure, and FIG. 4 is a cross-sectional view of FIG. 3, taken along the line IV-IV. Here, a pixel is a minimum unit of the OLED display 101 for displaying an image.

In addition, illustrated in FIG. 3 and FIG. 4 is an active matrix (AM) type of OLED display 101 with a 2Tr-1Cap structure where a pixel is provided with two thin film transistors (TFT) 10 and 20 and one capacitor 80, but the present invention is not limited thereto. That is, the organic light emitting diode display 101 may have three or more thin film transistors and two or more capacitors at each pixel, and various other structures with separate wires. Here, a pixel refers to a minimum image displaying unit, and is disposed at each pixel region. The OLED display 101 displays images through a plurality of pixels As shown in FIG. 3 and FIG. 4, the OLED display 101 includes a switching thin film transistor 10, a driving thin film transistor 20, a capacitor 80, and an organic light emitting diode (OLED) 70, which are formed at each pixel. Here, the driving circuit DC refers to the structure with the switching thin film transistor 10, the driving thin film transistor 20, and the capacitor 80. The display substrate 101 further includes gate lines 151 arranged to extend in a first direction, and data and common power lines 171 and 172 arranged to extend in a second direction crossing the first direction of the gate lines 151 in an insulated manner.

One pixel is defined by the gate lines 151, and the data and common power lines 171 and 172 as a boundary, but is not limited thereto.

As described above, the OLED 70 includes the first transflective electrode 710, the organic emission layer 720 formed on the first transflective electrode 710, and the second transflective electrode 730 formed on the organic emission layer 720. Holes and electrons from the first transflective electrode 710 and the second transflective electrode 730 are injected into the organic emission layer 720. The light emission occurs when the excitons (being the combinations of holes and electrons drop) from the excited state to the ground state.

The capacitor 80 includes a pair of capacitor plates 158 and 178 arranged with an interlayer insulating layer 160 therebetween. Here, the interlayer insulating layer 160 is a dielectric material. Charges charged in the capacitor 80 and a voltage between the two capacitor plates 158 and 178 determine capacitance.

The switching thin film transistor 10 includes a switching semiconductor layer 131, a switching gate electrode 152, a switching source electrode 173, and a switching drain electrode 174. The driving thin film transistor 20 includes a driving semiconductor layer 132, a driving gate electrode 155, a driving source electrode 176, and a driving drain electrode 177.

The switching thin film transistor 10 is used as a switch to select a pixel for light emission. The switching gate electrode 152 is connected to the gate line 151. The switching source electrode 173 is connected to the data line 171. The switching drain electrode 174 is distanced from the switching source electrode 173 and is connected to the capacitor plates 158.

The driving thin film transistor 20 applies driving power to the pixel electrode 710 for light emission of an organic emission layer 720 of an OLED 70 in the selected pixel. The driving gate electrode 155 is connected with the capacitor plate 158 that is connected with the switching drain electrode 174. The driving source electrode 176 and the capacitor plate 178 are respectively connected with the common power line 172. The driving drain electrode 177 is connected to the pixel electrode 710 of the OLED 70 through a contact hole.

With such a structure, the switching thin film transistor 10 is driven by a gate voltage applied to the gate line 151 to transmit a data voltage applied to the data line 171 to the driving thin film transistor 20. A voltage corresponding to a voltage difference between a common voltage applied to the driving thin transistor 20 from the common power line 172 and the data voltage transmitted from the switching thin film transistor 10 is stored in the capacitor 80, and a current corresponding to the voltage stored in the capacitor 80 flows to the OLED 70 through the driving thin film transistor 20 such that the OLED 70 emits light.

In addition, the use efficiency of light generated from the OLED 70 can be effectively improved by the DBEF 301.

Hereafter, an OLED display 102 according to a second exemplary embodiment will be described with reference to FIG. 5.

Figure 5:
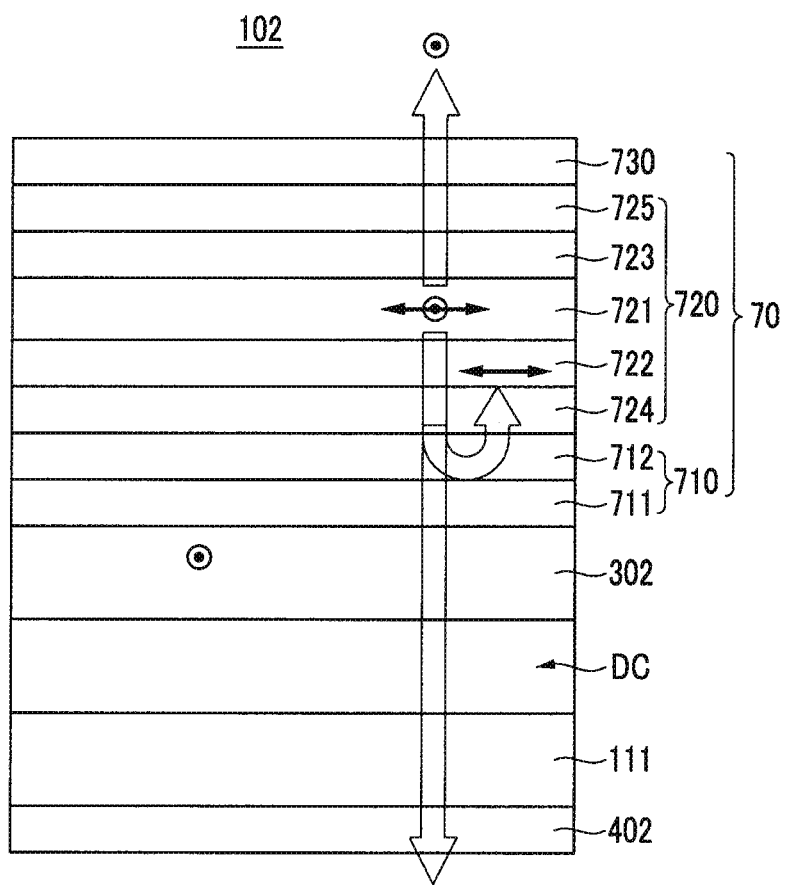
FIG. 5 is a partial cross-sectional view of an OLED display according to a second exemplary embodiment.

As shown in FIG. 5, in an OLED display 102 according to the second exemplary embodiment, a DBEF 302 is disposed below a first transflective electrode 710. A polarizing plate 402 is attached on (under or with) a substrate main body 111. A polarization axis of the DBEF 302 and a polarization axis of the polarizing plate 402 are parallel with each other.

With such a configuration, the OLED display 102 according to the second exemplary embodiment can improve light efficiency while displaying an image on both sides.

In addition, visibility can be improved by suppressing reflection of external light and loss of light emitted to the outside from an OLED 70 can be minimized.

An operation effect of the dual-side emission type of OLED display 102 including the DEBF 302 according to the second exemplary embodiment is substantially the same as in the first exemplary embodiment.

Hereinafter, an experimental example and a comparative example according to the first exemplary embodiment will be compared with reference to FIG. 1.

The experimental example and the comparative example have the same configuration, excluding whether a DBEF 301 is included or not. In more detail, a transflective layer 711 of a first transflective electrode 710 was formed of silver (Ag) with a thickness of 15 nm, and a transparent layer 712 of the first transflective electrode 710 was formed of ITO with a thickness of 7 nm. A hole injection layer (HIL) 724, a hole transport layer (HTL) 722, an electron transport layer (ETL) 723, and an electron injection layer (EIL) 725 respectively had thicknesses of 40 nm, 68 nm, 36 nm, and 1.5 nm. According to a color, a red-based emission layer 721 had a thickness of 40 nm and green-based and blue-based emission layers 721 respectively had thicknesses of 20 nm. In addition, an OLED 70 emitting red-based light used a cavity layer having a thickness of 72 nm, an OLED 70 emitting green-based light used a cavity layer having a thickness of 40 nm, and an OLED 70 emitting blue-based light did not use a cavity layer. A second transflective electrode 730 was formed of magnesium (Mg) and silver (Ag) with a thickness of 10 nm.

Color-specific luminance of the experimental example and the comparative example are as shown in Table 1.

TABLE 1

| Color | Luminance (cd/m2) of Experimental Example | | | Luminance (cd/m2) of Comparative Example | | |
|---|---|---|---|---|---|---|
| | rear | front | sum | rear | front | total |
| red | 6.74 | 21.03 | 27.77 | 7.89 | 13.47 | 21.36 |
| green | 5.55 | 22.23 | 27.78 | 12.16 | 11.10 | 23.26 |
| blue | 0.70 | 3.05 | 3.75 | 2.12 | 1.39 | 3.51 |

As shown in Table 1, the experimental example provided with the DBEF 301 according to the first exemplary embodiment had luminance that was improved by about 30% with respect to the luminance of the comparative example.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

DESCRIPTION OF CERTAIN SYMBOLS

| | |
|---|---|
| 10, 20: | thin film transistor |
| 70: | organic light emitting element |
| 101, 102: | OLED display |
| 111: | substrate main body |
| 190: | pixel defining layer |
| 195: | opening |
| 210: | encapsulation member |
| 301: | DBEF |
| 710: | first transflective electrode |
| 711: | transflective layer |
| 712: | transparent layer |
| 720: | organic emission layer |
| 721: | emission layer |
| 722: | hole transport layer (HTL) |
| 723: | electron transport layer (ETL) |
| 724: | hole injection layer (HIL) |
| 725: | electron injection layer (EIL) |
| 730: | second transflective electrode |
| 401, 402: | polarizing plate |

What is claimed is:

1. An organic light emitting diode (OLED) display comprising:
   a substrate main body;
   a first transflective electrode and a second first transflective electrode on the substrate main body, the second first transflective electrode being adjacent to the first transflective electrode;
   a first organic emission layer on the first first transflective electrode;

a second organic emission layer adjacent to the first organic emission layer, the second organic emission layer on the second first transflective electrode;

a first second transflective electrode on the first organic emission layer;

a second second transflective electrode on the second organic emission layer, and a dual brightness enhancement film (DBEF) contacting and disposed directly on a side each of the first first and second first transflective electrodes facing away from the first and second organic emission layers, or a side of each of the first second and second second transflective electrodes facing away from the first and second organic emission layers, wherein the OLED display is a dual-emission display.

2. The OLED display of claim 1, wherein the first first, second first, first second, and second second transflective electrodes comprise a transparent conductive material.

3. The OLED display of claim 2, wherein the transparent conductive material comprises at least one of indium tin oxide (ITO), indium zinc oxide (IZO), zinc oxide (ZnO), or indium oxide ($In_2O_3$).

4. The OLED display of claim 3, wherein one of either the first first and second first transflective electrodes, or the first second and second second transflective electrodes for injecting holes into the organic emission layer comprises the transparent conductive material.

5. The OLED display of claim 1, wherein the first first, second first, first second, and second second transflective electrodes comprise a transflective metal.

6. The OLED display of claim 5, wherein the transflective metal comprises magnesium (Mg), silver (Ag), gold (Au), calcium (Ca), lithium (Li), chromium (Cr), aluminum (Al), or an alloy thereof.

7. The OLED display of claim 6, wherein the transflective metal has a thickness of 5 nm to 50 nm.

8. The OLED display of claim 1, wherein the first first, second first, first second, and second second transflective electrodes comprise a transparent conductive material and a transflective metal.

9. The OLED display of claim 1, wherein the DBEF is configured to pass light parallel with a polarization axis and to reflect light not parallel with the polarization axis.

10. The OLED display of claim 1, further comprising an encapsulation member disposed facing the substrate main body and covering the first first and second first transflective electrodes, the first and second emission layers, and the first second and second second transflective electrodes.

11. The OLED display of claim 10, wherein light generated from the first and second organic emission layers is emitted in a direction to the substrate main body or the encapsulation member to display an image.

12. The OLED display of claim 10, wherein the DBEF is on the first second and second transflective electrodes.

13. The OLED display of claim 12, further comprising a polarizing plate attached to the encapsulation member,
wherein the polarizing plate has a polarization axis parallel with the DBEF.

14. The OLED display of claim 10, wherein the DBEF is disposed below the first first and second first transflective electrodes.

15. The OLED display of claim 14, further comprising a polarizing plate attached with the substrate main body,
wherein the polarizing plate has a polarization axis parallel with the DBEF.

16. An organic light emitting diode (OLED) display comprising:
a first first transflective electrode;
a second first transflective electrode adjacent to the first first transflectvie electrode;
a first second transflectvie electrode;
a second second transflective electrode;
a first organic emission layer between the first first transflective electrode and the first second transflective electrode;
a second organic emission layer adjacent to the first organic emission layer, the second organic emission layer on the second first transflectve electrode;
a dual brightness enhancement film (DBEF) contacting and disposed directly a side of each of the first first and second first transflective electrode facing away from the first and second organic emission layers, or a side of each of the first second and second second transflective electrodes facing away from the first and second organic emission layers, where the OLED display is a duel-emission display.

* * * * *